(12) United States Patent
Que et al.

(10) Patent No.: US 9,897,878 B2
(45) Date of Patent: Feb. 20, 2018

(54) THIN FILM TRANSISTOR ARRAY SUBSTRATE, LIQUID CRYSTAL DISPLAY PANEL AND REPAIR METHOD OF LIQUID CRYSTAL DISPLAY PANEL

(71) Applicant: SHENZHEN CHINA STAR OPTOELECTRONICS TECHNOLOGY CO., LTD., Shenzhen, Guangdong (CN)

(72) Inventors: Xiangdeng Que, Guangdong (CN); Shicai Lan, Guangdong (CN)

(73) Assignee: SHENZHEN CHINA STAR OPTOELECTRONICS TECHNOLOGY CO., LTD, Shenzhen (CN)

( * ) Notice: Subject to any disclaimer, the term of this patent is extended or adjusted under 35 U.S.C. 154(b) by 0 days.

(21) Appl. No.: 14/777,139

(22) PCT Filed: Jan. 31, 2014

(86) PCT No.: PCT/CN2014/071860
§ 371 (c)(1),
(2) Date: Oct. 1, 2015

(87) PCT Pub. No.: WO2015/100836
PCT Pub. Date: Jul. 9, 2015

(65) Prior Publication Data
US 2016/0291435 A1    Oct. 6, 2016

(30) Foreign Application Priority Data

Dec. 31, 2013    (CN) .......................... 2013 1 0754221

(51) Int. Cl.
*H01L 21/00*    (2006.01)
*G02F 1/1362*    (2006.01)
(Continued)

(52) U.S. Cl.
CPC ...... *G02F 1/136259* (2013.01); *G02F 1/1368* (2013.01); *G02F 1/13439* (2013.01);
(Continued)

(58) Field of Classification Search
CPC ......... H01L 2924/0002; H01L 2924/00; H01L 21/707; H01L 22/12; H01L 22/26;
(Continued)

(56) References Cited

U.S. PATENT DOCUMENTS

2008/0024406 A1    1/2008   Kim et al.
2009/0284680 A1    11/2009  Peng

FOREIGN PATENT DOCUMENTS

CN    1013132678 A    3/2008
CN    101178491 A     5/2008
(Continued)

*Primary Examiner* — Robert Bachner

(57) ABSTRACT

A TFT array substrate includes parallel data lines parallel extend along a first direction, parallel scan lines crossing the data lines and extending along a second direction perpendicular to the second direction, pixels defined by the data lines and the scan lines, and a common electrode having a main line and growth lines. The main line is parallel to the scan lines. The growth lines extend from the main line. Each pixel includes a pixel electrode, a TFT, partial of the main line, and two growth lines. The TFT is electrically connected to the pixel electrode, a corresponding data line, and a corresponding scan line. The projections of the two growth lines in the pixel overlap with the pixel electrode. Each pixel includes common areas. The common areas overlapping with the two growth lines.

16 Claims, 2 Drawing Sheets

(51) Int. Cl.
  *G02F 1/1343* (2006.01)
  *G02F 1/1368* (2006.01)
  *H01L 27/12* (2006.01)
  *H01L 29/786* (2006.01)

(52) U.S. Cl.
  CPC .. *G02F 1/134363* (2013.01); *G02F 1/136286* (2013.01); *H01L 27/124* (2013.01); *H01L 29/78633* (2013.01); *G02F 2001/136263* (2013.01); *G02F 2201/121* (2013.01); *G02F 2201/123* (2013.01)

(58) Field of Classification Search
  CPC ............... H01L 27/124; H01L 27/1255; H01L 27/1259; H01L 27/156; H01L 29/66765; H01L 21/67253; H01L 22/20; H01L 28/60; H01L 29/49
  See application file for complete search history.

(56) References Cited

FOREIGN PATENT DOCUMENTS

| | | |
|---|---|---|
| CN | 101266373 A | 9/2008 |
| CN | 101666948 A | 3/2010 |

THIN FILM TRANSISTOR ARRAY SUBSTRATE, LIQUID CRYSTAL DISPLAY PANEL AND REPAIR METHOD OF LIQUID CRYSTAL DISPLAY PANEL

FIELD OF THE INVENTION

The present invention relates to liquid crystal display technologies, and particularly, to a thin film transistor (TFT) array substrate, a liquid crystal display (LCD) panel having the TFT array substrate, and a repair method of the LCD panel.

BACKGROUND OF THE INVENTION

Generally, a LCD panel is driven by an active TFT array substrate. Each pixel in the TFT array substrate is electrically connected to a data line and a scan line to choose or input display voltage. The data line and the scan line are nearly ten thousands because of the pixels up to millions in the TFT array substrate. Spot defect and line defect are very tough issues in LCD manufacturing process. Currently, the major repair method for the spot defect is to cut off the signal input to the transparent conductive film (indium tin oxide, ITO), and at the same time, the transparent conductive film and the common electrode line (Com line) of defect pixels are soldered together and shorted, thereby repairing the defect pixels from a bright spot state to a normally-dark state. This process needs to grow the Com line. The major repair method for the line defect is repairing defect lines. This also needs to grow the Com line. However, when the TFT array substrate has both the spot defect and the line defect, the spot defect repairing and the line defect repairing are independent from each other. It not only makes the line arrangement complicated, but also increases the length of the Com line to-be-grown. This decreases an aperture ratio of the LCD panel.

Therefore, it is desired to provide a TFT array substrate, a LCD panel having the TFT array substrate, and a repair method of the LCD panel, which can overcome or at least alleviate the above-mentioned problem.

SUMMARY OF THE INVENTION

To solve the above-mentioned problem, the present invention provides a TFT array substrate. The TFT array substrate includes a number of data lines parallel to each other and extend along a first direction, a number of scan lines parallel to each other and extending along a second direction, a number of pixels defined by the data lines and the scan lines, and a common electrode having a main line and a plurality of growth lines. The scan lines cross the data lines. The first direction is perpendicular to the second direction. The main line is parallel to the scan lines. The growth lines extend from the main line. Each pixel includes a pixel electrode, a TFT, partial of the main line, and two growth lines. The TFT is electrically connected to the pixel electrode, a corresponding data line, and a corresponding scan line. The projections of the two growth lines in the pixel overlap with the pixel electrode. Each pixel includes common areas. The common areas overlapping with the two growth lines. Each common area is configured to be drilled to electrically connect the pixel electrode to a corresponding growth line, and is configured to be drilled to be electrically connected to a neighboring common area in the second direction which is drilled, and make the growth lines corresponding to the two drilled common areas electrically connect together.

Wherein, each the two growth lines in each pixel perpendicularly extend from opposite ends of the partial main line, and each of the two growth lines and the nearest growth lines in neighboring pixel are arranged in the same straight line along the first direction.

Wherein, the TFT array substrate further comprises a shielding metal, the shielding metal comprises a plurality of first shielding areas, a plurality of second shielding areas, and a plurality of common areas, the first shielding areas are spaced from the three data lines, the second shielding areas correspond to the pixels and are located in the areas corresponding to the four pixels, and each second shielding area in each pixel is connected to the first shielding areas at opposite sides of the second shielding area through the common areas.

Wherein, each of the second shielding areas in the pixels comprises two portions crossing each other or merely comprises one portion extending along the second direction.

Wherein, the common areas are the portions of the main line, and the two growth lines perpendicularly extend from opposite sides of the main line at the common area.

Wherein, each of the common areas is a triangle, a circle, a quadrilateral.

Wherein, the pixel electrode is a transparent conductive film made of indium tin oxide.

Wherein, the scan lines are made of a first metal layer for transmitting scan signals, the common electrode is made of the first metal layer, the data lines are made of a second metal layer for transmitting data signals.

To solve the above-mentioned problem, the present invention provides a LCD panel. The LCD panel includes a TFT array substrate. The TFT array substrate includes a number of data lines parallel to each other and extend along a first direction, a number of scan lines parallel to each other and extending along a second direction, a number of pixels defined by the data lines and the scan lines, and a common electrode having a main line and a plurality of growth lines. The scan lines cross the data lines. The first direction is perpendicular to the second direction. The main line is parallel to the scan lines. The growth lines extend from the main line. Each pixel includes a pixel electrode, a TFT, partial of the main line, and two growth lines. The TFT is electrically connected to the pixel electrode, a corresponding data line, and a corresponding scan line. The projections of the two growth lines in the pixel overlap with the pixel electrode. Each pixel includes common areas. The common areas overlapping with the two growth lines. Each common area is configured to be drilled to electrically connect the pixel electrode to a corresponding growth line, and is configured to be drilled to be electrically connected to a neighboring common area in the second direction which is drilled, and make the growth lines corresponding to the two drilled common areas electrically connect together.

Wherein, the two growth lines in each pixel perpendicularly extend from opposite ends of the partial main line, and each of the two growth lines and the nearest growth lines in neighboring pixel are arranged in the same straight line along the first direction.

Wherein, the TFT array substrate further comprises a shielding metal, the shielding metal comprises a plurality of first shielding areas, a plurality of second shielding areas, and a plurality of common areas, the first shielding areas are spaced from the three data lines, the second shielding areas correspond to the pixels and are located in the areas corresponding to the four pixels, and each second shielding area in each pixel is connected to the first shielding areas at opposite sides of the second shielding area through the common areas.

Wherein, wherein each of the second shielding areas in the pixels comprises two portions crossing each other or merely comprises one portion extending along the second direction.

Wherein, the common areas are the portions of the main line, and the two growth lines perpendicularly extend from opposite sides of the main line at the common area.

Wherein, each of the common areas is a triangle, a circle, a quadrilateral.

Wherein, the pixel electrode is a transparent conductive film made of indium tin oxide.

Wherein, the scan lines are made of a first metal layer for transmitting scan signals, the common electrode is made of the first metal layer, the data lines are made of a second metal layer for transmitting data signals.

To solve the above-mentioned problem, the present invention provides a repair method of the LCD panel. The repair method repairs spot defects and line spots on the TFT array substrate includes: when the pixel has a spot defect, a signal from the TFT to the pixel electrode in the pixel is cut off, the pixel electrode and the growth line overlapping with the pixel electrode are soldered together and shorted via laser drilling one of the common areas in the pixel, thereby repairing the spot defect in the pixel to a normally-dark state; and wen an intersecting point between the main line and the data line is broken, the common areas along the second direction are first drilled to form two holes by laser, the two holes are then plated to form two conductive holes, and the two conductive holes are finally electrically connected to each other with wires, thereby the growth lines corresponding to the two common areas are electrically connected to each other.

Wherein, when the main line at the intersecting point and the data line at the intersecting point are shorted, the main line at the intersecting point is cut off to eliminate the shorten circuit between the main line at the intersecting point and the data line at the intersecting point, the common areas are drilled to form two holes by laser, the two holes are plated to form two conductive holes, and the two conductive holes are electrically connected to each other with wires, and the growth lines corresponding to the two common areas are electrically connected to each other.

In the TFT array substrates, the LCD panel, and the repairing method of the LCD panel, the spot defect repairing and the line defect repairing can be simultaneously achieved via the common areas. It not only makes the line arrangement simple, but also decreases the length of the growth line. This increases an aperture ratio of the LCD panel.

BRIEF DESCRIPTION OF THE DRAWINGS

In order to illustrate technical schemes of the present invention or the prior art more clearly, the following section briefly introduces drawings used to describe the embodiments and prior art. Obviously, the drawing in the following descriptions just is some embodiments of the present invention. The ordinary person in the related art can acquire the other drawings according to these drawings without offering creative effort.

DETAILED DESCRIPTION OF THE PREFERRED EMBODIMENTS

The following sections offer a clear, complete description of the present invention in combination with the embodiments and accompanying drawings. Obviously, the embodiments described herein are only a part of, but not all of the embodiments of the present invention. In view of the embodiments described herein, any other embodiment obtained by the person skilled in the field without offering creative effort is included in a scope claimed by the present invention.

The First Embodiment

Figure 1:
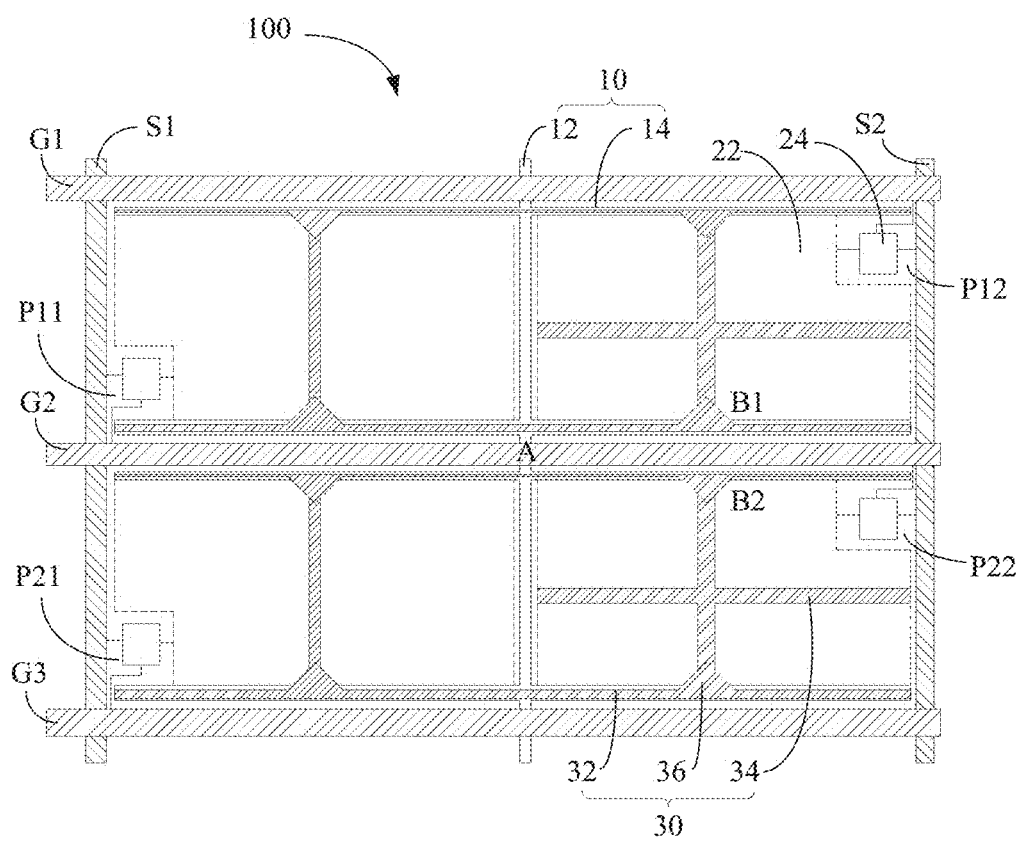
FIG. 1 is a schematic view of a TFT array substrate with a first exemplary embodiment of the present invention.

Referring to FIG. 1, a TFT array substrate 100, in accordance with a first embodiment, includes a number of data lines and a number of scan lines crossing the data lines. For explanation, the TFT array substrate 100 of this embodiment takes three data lines G1, G2, and G3 and two scan lines S1 and S2 as an example. The three data lines G1, G2, and G3 are parallel to each other and extend along a first direction (horizontal direction). The two scan lines S1 and S2 are parallel to each other and extend along a second direction (vertical direction). The TFT array substrate 100 further includes a common electrode 10, four pixies P11, P12, P21 and P22 defined by the three data lines G1, G2, and G3 and the two scan lines S1 and S2, and a shielding metal 30. The two scan lines S1 and S2 are made of a first metal layer for transmitting scan signals. The common electrode 10 is also made of the first metal layer. The three data lines G1, G2, and G3 are made of a second metal layer for transmitting data signals. The first metal layer is separated from the second metal layer by a silicon nitride insulation layer.

The common electrode 10 includes a main line 12 and eight growth lines 14. The main line 12 is arranged between the two scan lines S1 and S2, and is parallel to the two scan lines S1 and S2. In other words, the main line 12 extends along the second direction. The four pixies P11, P12, P21 and P22 are uniformly distributed at opposite sides of the main line 12. The eight growth lines 14 are uniformly distributed at opposite sides of the main line 12, and two growth lines 14 are arranged in each of the four pixies P11, P12, P21 and P22.

Each of the four pixies P11, P12, P21 and P22 includes a pixel electrode 22, a TFT 24, partial of the main line 12, and two growth lines 14. In this embodiment, the pixel electrode 22 is a transparent conductive film made of ITO. The gate electrode of the TFT 24 is electrically connected to the scan line S2 (take the pixel P12 as an example), the source electrode of the TFT 24 is electrically connected to the data line G1 (take the pixel P12 as an example), and the drain electrode of the TFT 24 is electrically connected to the pixel electrode 22. The two growth lines 14 in the pixel P12 perpendicularly extend from opposite ends of the partial main line 12, and each of the two growth lines 14 and the nearest growth lines 14 in neighboring pixel P11 are arranged in the same straight line along the first direction. That is, the eight growth lines 14 are arranged in four straight lines along the first direction. The projections of the two growth lines 14 overlap with the pixel electrode 22.

The shielding metal 30 includes four first shielding areas 32, four second shielding areas 34, and eight common areas 36. The projections of the four shielding areas 32 overlap with the projections of the growth lines 14 on the four straight lines. The four first shielding areas 32 are spaced from the three data lines G1, G2, and G3. The four second shielding areas 34 correspond to the four pixels P11, P12, P21, and P22, and are located in the areas corresponding to the four pixels P11, P12, P21, and P22. In detail, the second shielding area 34 in the pixel P12 or in the pixel P22 includes two portions crossing each other, and the second shielding area 34 in the pixel P11 or in the pixel P21 merely includes one portion extending along the second direction. Each of the four pixels P11, P12, P21, and P22 includes two common areas 36. The two common areas 36 extend from the two first shielding areas 32 in the corresponding pixel P11, P12, P21, or P22. Each second shielding area 34 in the pixel P11, P12, P21, or P2 is connected to the two first shielding areas 32 through the common areas 36. In this embodiment, the common areas 36 are substantially a triangle.

It is understood that the common areas 36 are not limited to be a triangle, and can be a circle, a quadrilateral or other polygons, and can be regular or irregular shape. The size of each of the common areas 36 is not limited, provided that each second shielding area 34 in the pixel P11, P12, P21, or P2 is connected to the two first shielding areas 32 through the common areas 36. In addition, in other embodiments, each of the four second shielding areas 34 in the four pixels P11, P12, P21, and P22 can include two portions crossing each other, or can merely include one portion along the second direction.

The Second Embodiment

A repair method of the LCD panel for repairing spot defects and line spots on the TFT array substrate 100 of the first embodiment includes the following steps.

When the pixel P12 has a spot defect, for example, the pixel P12 is a bright spot. A signal from the TFT 24 to the pixel electrode 22 in the pixel P12 is cut off. The pixel electrode 22 and the growth line 14 overlapping with the pixel electrode 22 are soldered together and shorted via laser drilling one of the common areas 36 in the pixel P12, such as laser drilling the common area 36 at point B1, thereby repairing the spot defect in the pixel P12 to a normally-dark state.

When an intersecting point A between the main line 12 and the data line G2 is broken, the common areas 36 at points B1 and B2 are first drilled to form two holes by laser, the two holes are then plated to form two conductive holes, and the two conductive holes are finally electrically connected to each other with wires. Thus, the growth lines 14 corresponding to the two common areas 36 at point B1 and B2 are electrically connected to each other.

When the main line 12 at the intersecting point A and the data line G2 at the intersecting point A are shorted because the silicon nitride insulation layer is broken or because the main line 12 at the intersecting point A and the data line G2 at the intersecting point A are strike by static electricity, the main line 12 at the intersecting point A is first cut off to eliminate the shorten circuit between the main line 12 at the intersecting point A and the data line G2 at the intersecting point A, the common areas 36 at the points B1 and B2 are drilled to form two holes by laser, the two holes are then plated to form two conductive holes, and the two conductive holes are finally electrically connected to each other with wires. Thus, the growth lines 14 corresponding to the two common areas 36 at the two point B1 and B2 are electrically connected to each other.

The Third Embodiment

Figure 2:
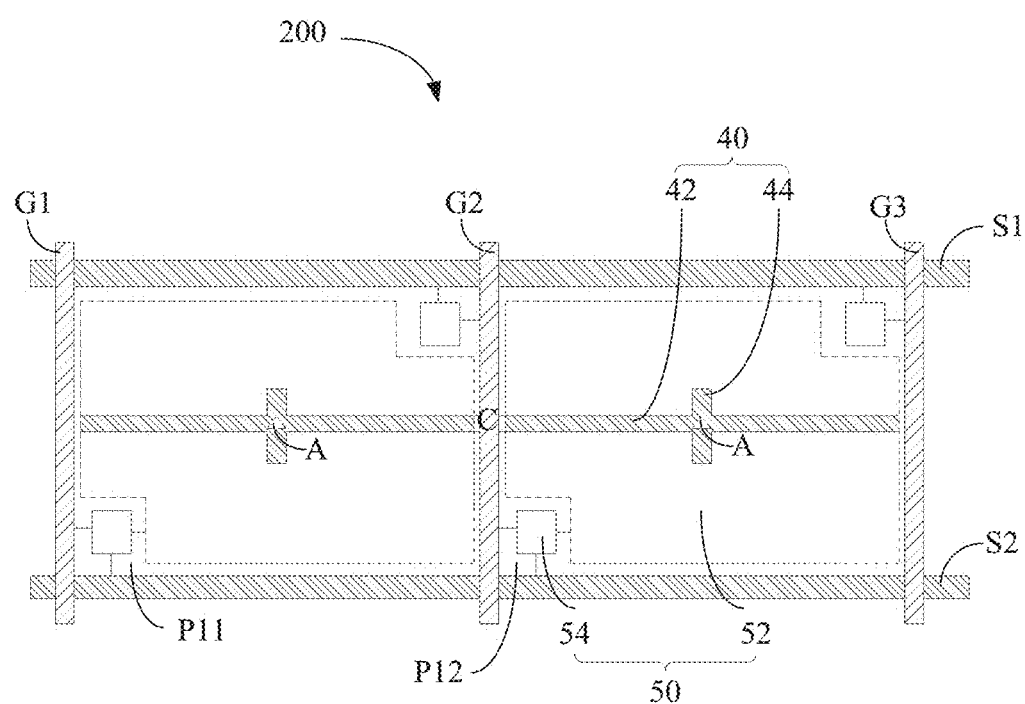
FIG. 2 is a schematic view of a TFT array substrate with a second exemplary embodiment of the present invention.

Referring to FIG. 2, a TFT array substrate 200, in accordance with a second embodiment, includes a number of data lines and a number of scan lines crossing the data lines. For explanation, the TFT array substrate 200 of this embodiment takes three data lines G1, G2, and G3 and two scan lines S1 and S2 as an example. The three data lines G1, G2, and G3 are parallel to each other and extend along a first direction (vertical direction). The two scan lines S1 and S2 are parallel to each other and extend along a second direction (horizontal direction). The TFT array substrate 200 further includes a common electrode 40, two pixies P11 and P12 defined by the three data lines G1, G2, and G3 and the two scan lines S1 and S2. The two scan lines S1 and S2 are made of a first metal layer for transmitting scan signals. The common electrode 40 is also made of the first metal layer. The three data lines G1, G2, and G3 are made of a second metal layer for transmitting data signals. The first metal layer is separated from the second metal layer by a silicon nitride insulation layer.

The common electrode 40 includes a main line 42 and four growth lines 44. The main line 42 is arranged between the two scan lines S1 and S2, and is parallel to the two scan lines S1 and S2. In other words, the main line 42 extends along the second direction. The main line 42 passes through the two pixels P11 and P12. The four growth lines 44 are uniformly distributed at opposite sides of the main line 12, and each of the four pixies P11 and P12 has two growth lines 44.

Each of the two pixies P11 and P12 includes a pixel electrode 52, a TFT 54, partial of the main line 42, and two growth lines 44. In this embodiment, the pixel electrode 52 is a transparent conductive film made of ITO. The gate electrode of the TFT 54 is electrically connected to the scan line S2 (take the pixel P12 as an example), the source electrode of the TFT 54 is electrically connected to the data line G2 (take the pixel P12 as an example), and the drain electrode of the TFT 54 is electrically connected to the pixel electrode 52. The partial main line 42 defines a common area A (triangle in FIG. 2). The two growth lines 44 perpendicularly extend from opposite sides of the main line 42 at the common area A. The projections of the two growth lines 44 overlap with the pixel electrode 52. The structure of the pixel P11 is the same as that of the pixel P12.

It is understood that the common areas A are not limited to be a triangle, and can be a circle, a quadrilateral or other polygons, and can be regular or irregular shape. The size of each of the common areas 36 is not limited, and can be changed.

A repair method of the LCD panel for repairing the spot defects and line spots on the TFT array substrate 200 of the third embodiment includes the following steps.

When the pixel P12 has a spot defect, for example, the pixel P12 is a bright spot. A signal from the TFT 54 to the pixel electrode 52 in the pixel P12 is cut off. The pixel electrode 52 and the main line 42 overlapping with the pixel electrode 52 are soldered together and shorted via laser drilling the common area A in the pixel P12, thereby repairing the spot defect in the pixel P12 from a bright spot state to a normally-dark state.

When a portion of the main line 42 between the two common areas A is broken, the two common areas A are first drilled to form two holes by laser, the two holes are then plated to form two conductive holes, and the two conductive holes are finally electrically connected to each other with wires. Thus, the growth lines 44 corresponding to the two common areas A are electrically connected to each other.

When the main line 42 at the intersecting point C and the data line G2 at the intersecting point C are shorted because the silicon nitride insulation layer is broken or because the main line 42 at the intersecting point C and the data line G2 at the intersecting point C are strike by static electricity, the main line 42 at the intersecting point C is first cut off to eliminate the shorten circuit between the main line 42 at the intersecting point C and the data line G2 at the intersecting point C, the common areas A are drilled to form two holes by laser, the two holes are then plated to form two conductive holes, and the two conductive holes are finally electrically connected to each other with wires. Thus, the growth lines 44 corresponding to the two common areas A are electrically connected to each other.

In addition, the present invention also provides a LCD panel. The LCD panel includes a TFT array substrate 100 of the first embodiment or the TFT array substrate 200 of the third embodiment.

In the TFT array substrates 100 and 200, the LCD panel, and the repairing method of the LCD panel, the spot defect repairing and the line defect repairing can be simultaneously achieved via the common area 36 or the common area A. It not only makes the line arrangement simple, but also decreases the length of the growth line. This increases an aperture ratio of the LCD panel.

What is said above are only preferred examples of present invention, not intended to limit the present invention, any modifications, equivalent substitutions and improvements etc. made within the spirit and principle of the present invention, should be included in the protection range of the present invention.

What is claimed is:

1. A thin film transistor (TFT) array substrate comprising a plurality of data lines parallel to each other and extending along a first direction, a plurality of scan lines parallel to each other and extending along a second direction, a plurality of pixels defined by the data lines and the scan lines, and a common electrode having a main line and a plurality of growth lines, the scan lines crossing the data lines, the first direction being perpendicular to the second direction, the main line being parallel to the scan lines, the growth lines extending from the main line, each pixel comprising a pixel electrode, a TFT, partial of the main line, and two growth lines, the TFT electrically connected to the pixel electrode, a corresponding data line, and a corresponding scan line, the projections of the two growth lines in the pixel overlapping with the pixel electrode, each pixel having common areas, the common areas overlapping with the two growth lines, each common area electrically connects the pixel electrode to a corresponding growth line, and is electrically connected to a neighboring common area in the second direction, and the growth lines corresponding to the two common areas are electrically connected together.

2. The TFT array substrate of claim 1, wherein the two growth lines in each pixel perpendicularly extend from opposite ends of the partial main line, and each of the two growth lines and the nearest growth lines in neighboring pixel are arranged in the same straight line along the first direction.

3. The TFT array substrate of claim 2, wherein the TFT array substrate further comprises a shielding metal, the shielding metal comprises a plurality of first shielding areas, a plurality of second shielding areas, and a plurality of common areas, the first shielding areas are spaced from the three data lines, the second shielding areas correspond to the pixels and are located in the areas corresponding to the four pixels, and each second shielding area in each pixel is connected to the first shielding areas at opposite sides of the second shielding area through the common areas.

4. The TFT array substrate of claim 3, wherein each of the second shielding areas in the pixels comprises two portions crossing each other or merely comprises one portion extending along the second direction.

5. The TFT array substrate of claim 1, wherein the common areas are the portions of the main line, and the two growth lines perpendicularly extend from opposite sides of the main line at the common area.

6. The TFT array substrate of claim 1, wherein each of the common areas is a triangle, a circle, a quadrilateral.

7. The TFT array substrate of claim 1, wherein the pixel electrode is a transparent conductive film made of indium tin oxide.

8. The TFT array substrate of claim 1, wherein the scan lines are made of a first metal layer for transmitting scan signals, the common electrode is made of the first metal layer, the data lines are made of a second metal layer for transmitting data signals.

9. A liquid crystal display (LCD) panel comprising a TFT array substrate, the TFT array substrate comprising a plurality of data lines parallel to each other and extending along a first direction, a plurality of scan lines parallel to each other and extending along a second direction, a plurality of pixels defined by the data lines and the scan lines, and a common electrode having a main line and a plurality of growth lines, the scan lines crossing the data lines, the first direction being perpendicular to the second direction, the main line being parallel to the scan lines, the growth lines extending from the main line, each pixel comprising a pixel electrode, a TFT, partial of the main line, and two growth lines, the TFT electrically connected to the pixel electrode, a corresponding data line, and a corresponding scan line, the projections of the two growth lines in the pixel overlapping with the pixel electrode, each pixel having common areas, the common areas overlapping with the two growth lines, each common area electrically connects the pixel electrode to a corresponding growth line, and is electrically connected to a neighboring common area in the second direction, and the growth lines corresponding to the two common areas are electrically connected together.

10. The LCD panel of claim 9, wherein the two growth lines in each pixel perpendicularly extend from opposite ends of the partial main line, and each of the two growth lines and the nearest growth lines in neighboring pixel are arranged in the same straight line along the first direction.

11. The LCD panel of claim 10, wherein the TFT array substrate further comprises a shielding metal, the shielding metal comprises a plurality of first shielding areas, a plurality of second shielding areas, and a plurality of common areas, the first shielding areas are spaced from the three data lines, the second shielding areas correspond to the pixels and are located in the areas corresponding to the four pixels, and each second shielding area in each pixel is connected to the first shielding areas at opposite sides of the second shielding area through the common areas.

12. The LCD panel of claim 11, wherein each of the second shielding areas in the pixels comprises two portions crossing each other or merely comprises one portion extending along the second direction.

13. The LCD panel of claim 9, wherein the common areas are the portions of the main line, and the two growth lines perpendicularly extend from opposite sides of the main line at the common area.

14. The LCD panel of claim 9, wherein each of the common areas is a triangle, a circle, a quadrilateral.

15. The LCD panel of claim 9, wherein the pixel electrode is a transparent conductive film made of indium tin oxide.

16. The LCD panel of claim 9, wherein the scan lines are made of a first metal layer for transmitting scan signals, the common electrode is made of the first metal layer, the data lines are made of a second metal layer for transmitting data signals.

\* \* \* \* \*